MULTI-STABLE SUPERCONDUCTIVE ELECTRICAL CIRCUIT

Filed Feb. 14, 1962

Inventors
Alfred G. Emslie
Carl Russell Smallman
by Roberts, Cushman & Grover
Attys 3,188,488
Patented June 8, 1965

3,188,488

MULTI-STABLE SUPERCONDUCTIVE ELECTRICAL CIRCUIT

Carl Russell Smallman, Lexington, and Alfred G. Emslie, Scituate, Mass., assignors to Arthur D. Little, Inc., Cambridge, Mass., a corporation of Massachusetts Filed Feb. 14, 1962, Ser. No. 173,309
7 Claims. (Cl. 307—88.5)

This application is a continuation-in-part of United States patent applications Nos. 676,061, filed August 5, 1957, and 700,904, filed December 5, 1957.

This invention relates to an electrical circuit having a plurality of stable current conducting conditions and more particularly to a circuit in which current is carried by superconductive elements.

Various superconductive materials are known which are capable of a change of state from one of finite electrical resistance to one of zero resistance. For example, a body of lead cooled to 7.2 degrees Kelvin suddenly drops to zero resistance. The temperature at which superconductive materials undergo such transition is dependent on the magnetic field about the material. The critical temperature of 7.2° K. for lead supposes a zero magnetic field. As the field increases toward approximately 800 oersteds the transition temperature drops toward zero, and at intermediate temperatures there is a critical field which, if exceeded, will cause the lead body to change from superconducting state to a state of finite resistance. Thus for any given temperature below critical temperature there is a predetermined critical or threshold value of magnetic field above which lead undergoes transition from the superconducting state, and the transisition between superconduction and finite resistance can be effected by varying the magnetic field respectively below and above the predetermined value of magnetic field. Above the critical temperature no reduction of field can restore superconduction. Herein the term superconductive is used to designate the capability of the body to change between the above-mentioned states, while superconducting or superconduction designates the zero resistance state.

A body of superconductive material acts as a gate when controlled by a magnetic field. That is, if the gate body is in superconducting state and is conducting electrical current, a magnetic field above the aforesaid predetermined value will cause the gate body to impede the current. A superconductive gate and magnetic control winding is known as a cryotron.

According to the invention a multi-stable electrical circuit comprises current-supply means and current-collection means, superconductive means forming at least two paths between said current means, means for impeding current in one of said paths, and current detecting means in the magnetic field of at least one of said paths, said paths being magnetically independent of each other, whereby said circuit may assume a condition in which current flows in both paths or, when current is impeded in one path, a condition in which current flows in another path, said detecting means being influenced by a change between said conditions.

Further according to the invention current may be divided in an electrical circuit comprising current-supply means and current-collection means, superconductive means forming at least two paths between said current means, for each path a plurality of control means for applying magnetic fields at a plurality of locations along said path thereby to introduce a plurality of increments of impedance in said paths respectively, said paths being magnetically independent of each other, whereby current may be divided among the paths inversely dependent on the impedance therein, and means for detecting a change in current in at least one path.

For the purpose of illustration typical embodiments of the invention are shown in the accompanying drawing in which.

Figure 1:
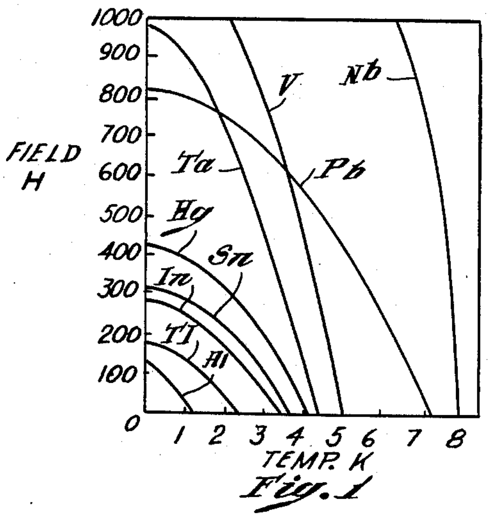
FIG. 1 is a plot of transition temperature against magnetic field applied to several superconductive elements.

As shown in FIG. 1 various elements are capable of superconduction, depending upon the temperature and magnetic field of their environment. In this figure are shown the transition curves of aluminum (Al), thallium (Tl), indium (In), tin (Sn), mercury (Hg), tantalum (Ta), vanadium (V), lead (Pb) and niobium (Nb). For each of these elements the curve is a plot of the transition temperature as a function of the applied magnetic field. Below the curve the element is superconducting, and above the curve the element has a finite resistance usually less than the resistance at room temperature.

Figure 2:
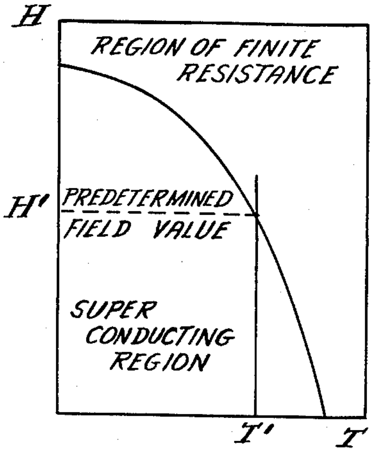
FIG. 2 is a similar plot illustrating transition of a superconductive body between states.

As shown in FIG. 2 the transition curve is the boundary between the superconducting region and finite resistance region of a given element. For a given temperature environment T′ there is a predetermined magnetic field value H′ at the transition point or zone. Increasing the field above the predetermined value H′ destroys superconduction, while reducing the field below the predetermined value establishes superconduction.

Figure 3:
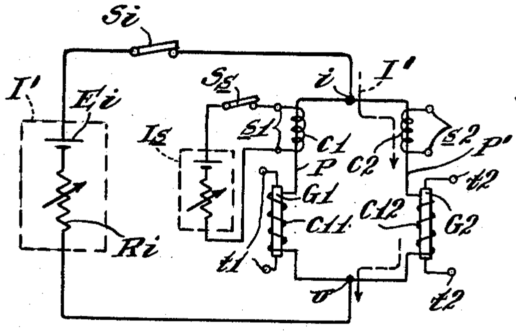
FIG. 3 is a schematic diagram of a bistable superconductive circuit and its power supply.
Figure 4:
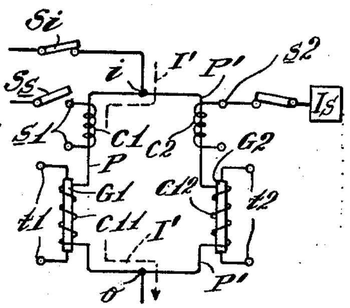
FIG. 4 is a diagram showing alternative operation of the circuit of FIG. 3.

One principle by which the magnetic control of a superconductor may be applied to a bistable circuit according to the invention is illustrated in FIGS. 3 and 4, wherein there is shown a superconductive circuit comprising a current input junction *i* and a current output junction *o* between which are connected two superconductive wires or paths P and P′. A substantially constant current is applied between the terminals *i* and *o* by a primary current source I′ which typically comprises a voltage source E*i* and a variable resistance R*i* which is large compared to the resistance of the bistable circuit P–P′. The primary current source I′ is connected to the input junction *i* by current interrupting means S*i*, which is shown as a simple single pole, single throw switch, but which may be any means capable of interrupting current to the input junction *i*.

A secondary current source I*s* supplies a control or set current through set terminals *s*1 and a set switch S*s* to a control coil C1 embracing the wire P forming one path of the bistable circuit. The paths P and P′ include output control coils C11 and C12 respectively embracing superconductive gates G1 and G2 which control current in external circuits (not shown) connected respectively to terminals *t*1 or *t*2. A like secondary source I*s* is connected through a switch S*s* to set terminals *s*2.

The operation of the bistable circuit of FIG. 3 is as follows: When the primary current source I′ is connected by the switch S*i* to the current input junction *i*, the primary current I′ will divide in some manner between the two paths P and P′, unless a secondary switch S*s* is closed. If switch S*s* to terminal *s*1 is closed, a control current will flow through the set coil C1 applying a magnetic field to the wire of path P, thereby raising its field above the predetermined field value illustrated in FIG. 2 and driving the wire P from superconducting state to a state of finite resistance. Current flowing between the input *i* and the output *o* will have a choice of a resistive path P and a non-resistive path P′ and will be diverted wholly into the non-resistive path P′ as shown by the broken line arrow in FIG. 3. When the control current is removed the current division will remain unchanged. The increase of current in the selected path P′ will then increase the current through the output control coil C12 to a value above the predetermined field of the output gate G and will thereby introduce a finite resistance between the terminals *t2*. The potential drop across this resistance may be measured by an indicating instrument such as a voltmeter or may be used to control other superconductive circuits.

Alternatively, as shown in FIG. 4, if the other set switch applies set current through terminals *s2* and control coil *c2* the primary current I′ will be diverted to path P thereby destroying superconduction in gate G1.

Figure 6:
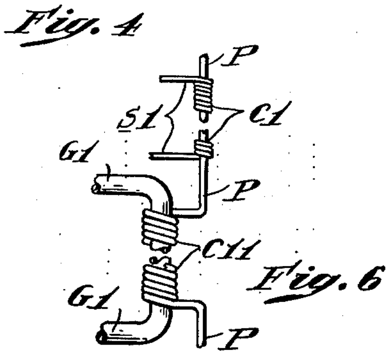
FIG. 6 is an elevation of a typical cryotron path.

Shown in FIG. 6 as one example of the superconductive material used in the bistable circuit, the alternate paths P and P′ may be lead (Pb) wire approximately 0.005 inch in diameter; the set coil C1 may comprise one hundred turns of 0.003 inch diameter niobium wire wound on the lead wire P; and the gate G1 may be a length of tantalum wire 0.009 inch in diameter on which one hundred turns of the lead wire P′ are wound to form the output coil C11. The primary current I′ for such a circuit may be approximately 1,000 milliamps, and the secondary current $I_s$, 500 milliamps.

Figure 5:
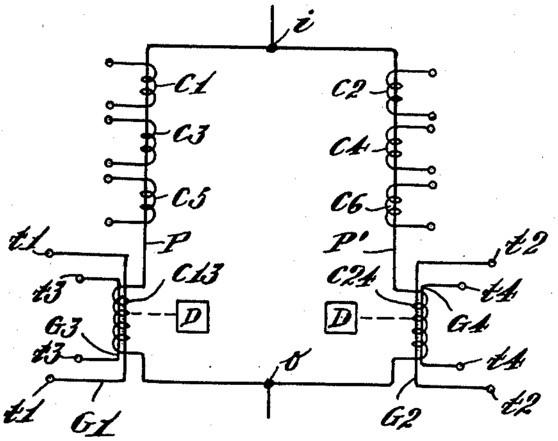
FIG. 5 is a schematic diagram of a multi-stable superconductive circuit having multiple input and output means.

According to the present invention the current diverting principle illustrated in FIGS. 3 and 4, may be used in the circuit of FIG. 5 to divide current between two paths in a predetermined ratio.

The multi-stable circuit of FIG. 5 comprises the input junction *i* and output junction *o*, and paths P and P′ as in FIGS. 3 and 4. Both branch paths P and P′ include control coils respectively C13 and C24. The control coil C13 embraces two gates G1 and G3 respectively having output terminals *t1* and *t3*. The control coil C24 embraces output gates G2 and G4, respectively having output terminals *t2* and *t4*. Alternatively, the control coils C13 and C24 may control a magneto-resistive device D or a superconducting galvanometer armature which deflects in proportion to the current flowing through the control coil and the magnetic field associated with such current. Path P is controlled by three input coils C1, C3 and C5. The alternate path P′ is controlled by coils C2, C4 and C6. Since each coil occupies some length of space along each path, passage of current through one or more of the input coils C1 to C6 will introduce one or more increments of resistance in the embraced path. For example, if control current sufficient to establish a magnetic field above the predetermined value of the superconductive material of paths P and P′ is passed through coils C1, C3 and C2, the resistance introduced into path P will be twice that of the resistance introduced into P′. The current flowing through both paths will tend to divide one-third in path P and two-thirds in path P′. If the control currents are removed simultaneously, the current distribution will remain unchanged. The magnitude of the current in each path may be determined by the magneto-resistive devices D or may be detected by the output gates G1 to G4. By the use of different superconductive materials for gates G1 and G3 different current in branch P may be differentiated. For example, by adjusting the boiling point of liquid helium through pressure control, a temperature T′ may be selected at which the predetermined field value of a vanadium (V) gate G1 is a multiple of the predetermined field of a tantalum gate G3. The tantalum gate will then be made resistive by a ⅓ I′ field in coil C13 which is less than the ⅔ I′ needed to destroy superconduction in the vanadium gate. With the circuit of FIG. 5 the current in paths P and P′ can be split in a number of combinations or stable conditions depending on the ratios of current in the respective paths.

It should be understood that the above-described embodiment of the invention is shown for the purpose of illustration only and that the present invention includes all modifications and equivalents of the invention defined in the claims.

We claim:

1. An electrical circuit comprising current-supply means and current-collection means, superconductive means forming at least two paths between said current means, for each path a plurality of control means for applying magnetic fields at a plurality of increments of impedance in said paths respectively, the control means for one path being operable independently of those for any other path and said paths being magnetically independent of each other, whereby current may be variably divided among the paths inversely dependent on the impedance therein through the application of magnetic fields by control means at one or more locations in each said path, and means for detecting a change in current in at least one path.

2. An electrical circuit comprising current-supply means and current-collection means, superconductive means forming at least two paths between said current means, a plurality of control means in relation to apply magnetic fields to each path at a plurality of spaced locations for influencing said locations respectively to change to resistive state, the control means for one path being operable independently of those for any other path and said control means separately controlling said locations whereby different increments of resistance may be introduced in respective paths thereby variably to divide current in the paths inversely dependent on the respective resistances through the application of magnetic fields by control means at one or more locations in each said path, and means for detecting a change of current in at least one path.

3. An electrical circuit comprising superconductive means forming at least two paths, common current-supply and current-collection junctions for said paths, a current source, connections between said current source and said current means, each of said superconductive means including a body of material responsive to a predetermined magnetic field to change between a superconducting state and a state of finite resistance, said paths being magnetically independent so that current can flow in each path, a plurality of control means in relation to apply magnetic fields to each path at different locations for applying magnetic fields thereto thereby incrementally to influence said locations to change to resistive state, the control means for one path being independently of those for any other path and means for selectively supplying current to said control means whereby said circuit may assume a condition in which current is variably divided between said paths dependent on the resistance in said paths respectively through the application of magnetic fields by control means at one or more locations in each said path, one of said paths forming an output control means, and a superconductive gate in the field of said output means for detecting a change of current in said one path.

4. A multi-stable electrical circuit comprising current input and output terminals, superconductive means forming at least two current carrying paths between said terminals, said superconductive means being responsive to a magnetic field to change between a state of zero resistance and a resistive state, said paths being magnetically independent of each other so that current may flow simultaneously in both paths, for each path control means for independently applying a magnetic field to said path thereby to influence a change of path to resistive state, whereby current may be diverted from said path in resistive state to the other path in non-resistive state, and superconductive gate means in the magnetic field of each of said paths, said gate means being influenced when current is diverted as aforesaid, whereby said circuit can assume any one of three stable states, a state in which current flows in one of said two paths, a state in which current flows in the other of said paths, and a condition in which current flows in both of said paths simultaneously.

5. A multi-stable electrical circuit comprising superconductive means forming at least two current carrying paths, common current-supply and current-collection junctions for said paths, a current source, connections between said current source and said junctions, each of said superconductive means including a body of material responsive to a predetermined magnetic field to change between a superconducting state and a state of finite resistance, said paths being magnetically independent so that current can flow simultaneously in both paths, for each path control means adjacent said path for applying a magnetic field thereto thereby to influence a change to resistive state, whereby said circuit may assume a condition in which when current is impeded in either one of said paths, current is diverted from said one path to the other, each of said paths forming output control means, and a superconductive gate in the field of each of said output means for detecting the condition of current in said path, whereby said circuit can assume any one of three stable states, a state in which current flows in one of said two paths, a state in which current flows in the other of said paths, and a condition in which current flows in both of said paths simultaneously.

6. A multi-stable electrical circuit comprising superconductive means forming a closed loop providing at least two current carrying paths, common current-supply and current-collection junctions for said paths, a current source, connections between said current source and said current junctions, each of said superconductive means including a body of material responsive to a predetermined magnetic field to change between a superconducting state and a state of finite resistance, said paths being magnetically independent so that current can flow simultaneously in both paths, control means adjacent each path for applying a magnetic field thereto thereby to influence a change to resistive state, interruptible means for applying current to one of said control means, whereby said circuit may assume a condition in which current is diverted from one of said paths to another, each of said paths forming magnetic output control means, and a superconductive gate in the field of each of said output means for detecting a change of current in said path, whereby said circuit can assume any one of three stable states, a state in which current flows in one of said two paths, a state in which current flows in the other of said paths, and a condition in which current flows in both of said paths simultaneously.

7. The circuit according to claim 4 wherein said two paths are physically substantially symmetrical.

References Cited by the Examiner

UNITED STATES PATENTS

| | | | |
|---|---|---|---|
| 2,832,897 | 4/60 | Buck | 307—88.5 |
| 2,958,836 | 11/60 | McMahon | 307—88.5 |
| 2,959,688 | 11/60 | Buck | 340—173.1 |
| 2,989,714 | 6/61 | Park et al. | 307—88.5 |
| 3,015,041 | 12/61 | Young | 307—88.5 |
| 3,047,743 | 7/62 | Brennemann | 307—88.5 |

FOREIGN PATENTS

| | | |
|---|---|---|
| 1,094,801 | 12/60 | Germany. |

ARTHUR GAUSS, *Primary Examiner.*